(12) United States Patent
Lee et al.

(10) Patent No.: US 6,440,833 B1
(45) Date of Patent: Aug. 27, 2002

(54) METHOD OF PROTECTING A COPPER PAD STRUCTURE DURING A FUSE OPENING PROCEDURE

(75) Inventors: Tze-Liang Lee; Mong-Song Liang, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/619,030

(22) Filed: Jul. 19, 2000

(51) Int. Cl.[7] .............................................. H01L 21/44
(52) U.S. Cl. ........................................ 438/601; 438/132
(58) Field of Search ................................. 438/132, 253, 438/396, 466, 467, 468, 600, 601, 626, 627, 628, 622, 623, 642, 680, 681, 687, 692, 672, 675, 702, 723, 724, 740, 751, 756, 636

(56) References Cited
U.S. PATENT DOCUMENTS 5,063,175 A  * 11/1991 Broadbent .................. 438/132
5,731,624 A  *  3/1998 Motsiff et al. ............... 257/529
5,795,819 A      8/1998 Motsiff et al. ............... 438/618
5,989,993 A     11/1999 Zakel et al. ................. 438/614
6,017,824 A  *  1/2000 Lee et al. .................... 438/712
6,124,165 A  *  9/2000 Lien ............................ 438/253

* cited by examiner

Primary Examiner—David Nelms
Assistant Examiner—David Nhu
(74) Attorney, Agent, or Firm—George O. Saile; Stephen B. Ackerman

(57) ABSTRACT

A process for simultaneously forming a first opening to a copper contact structure, and a deeper, second opening, overlying a fuse structure, has been developed. The process features the use of a barrier metal shape, located on a recessed copper contact structure, providing the needed etch stop during a dry etching procedure used to define a first opening in a composite insulator layer. The low etch rate exhibited by the barrier metal shape, in this dry etching environment provides protection of the recessed copper contact structure during the extended dry etching procedure, which is employed to form a deeper, second opening, in thicker dielectric layers, in a region overlying the fuse structure.

22 Claims, 5 Drawing Sheets

METHOD OF PROTECTING A COPPER PAD STRUCTURE DURING A FUSE OPENING PROCEDURE

BACKGROUND OF THE INVENTION (1) Field of the Invention

The present invention relates to methods used to fabricate semiconductor devices, and more specifically to a method used to form an opening to, and then to protect, a copper structure, during a procedure used to form a fuse opening.

(2) Description of Prior Art

Fuse, of antifuse elements have been used to allow defective regions, in a body of array devices, to be replaced with adjacent, spare device arrays. This is accomplished by placing a programmable fuse or antifuse element, between the main body of gate arrays, and a region comprised of replacement gate arrays. The fuse or antifuse element can sometimes be comprised of a high resistance material, such as amorphous silicon, resulting in an "off" state. The high resistance material, although physically connected to both the main body of gate arrays, and the region of replacement arrays, is not electrically connected due its high resistance. A laser or high voltage pulsing procedure, results in the conversion of the high resistance amorphous silicon layer to a low resistance layer, resulting in the "on" state, featuring electrical, as well as physical connection to both the main body of gate arrays, and to the region of spare gate arrays.

To reduce processing costs and complexity the fuse opening in dielectric layers, used to expose the region of the fuse structure to be pulsed, is sometimes simultaneously accomplished with an opening procedure used to expose the top surface of a metal pad structure, wherein the metal pad structure is either used to accept a wire bond, or to be used as a pad for a "flip chip" attachment to a ceramic module, or package. However the underlying fuse structure is located deeper than the metal pad structure, therefore if simultaneous openings are desired, via dry etching procedures, the metal pad structure will be exposed to additional dry etching procedures used to form a deeper opening for exposure of the fuse structure. The exposed metal pad layer, sometimes comprised of copper, can therefore be damaged when subjected to the additional dry etching needed to complete the fuse opening.

This invention will describe a procedure for simultaneously forming openings to a copper pad structure, and to a fuse structure, in which the fuse opening, formed in a group of dielectric layers, is deeper then the opening to the metal pad structure, which is formed in a thinner group of dielectric layers. This is accomplished via forming a barrier layer, overlying a recessed metal pad structure, offering high etch rate selectivity between the dielectric layers, overlying the fuse structure, and the barrier layer, thus protecting the metal, or copper pad structure, during the remaining fuse opening procedure. Prior art, such as Motsiff et al, in U.S. Pat. No. 5,795,819, describe a procedure for simultaneously forming openings to a wire bond pad, and to a fuse structure. However that prior art forms both openings in the same thickness of insulator, therefore not describing the novel barrier layer, overlying a recessed metal pad structure, needed in the present invention for protection of the metal pad structure during the conclusion of the fuse opening procedure.

SUMMARY OF THE INVENTION

It is an object of this invention to simultaneously form an opening to a metal pad structure, in a first group of dielectric layers, and to form a deeper opening to a fuse structure, in a second group of dielectric layers, with the first group of dielectric layers included in the thicker, second group of dielectric layers.

It is another object of this invention to recess the metal pad structure, below the top surface of the dielectric layer in which the metal pad structure is located in.

It is still another object of this invention to form a barrier metal shaper on the top surface of the recessed metal pad structure.

It is still yet another object of this invention to simultaneously form openings to the metal pad structure, and to the fuse structure, via a dry etching procedure which exhibits high etch rate selectivity between the groups of dielectric layers, and the barrier metal shape, located on the recessed metal pad structure.

In accordance with the present invention a method of forming an opening to a metal contact structure, and simultaneously forming a deeper opening to a fuse structure, featuring the use of a barrier metal shape, overlying a recessed metal pad structure, is described. A metal contact structure is formed in a dual damascene opening in a first composite dielectric layer. The metal contact structure is then recessed below the top surface of the first composite dielectric, exposing an underlying metal interconnect structure. A barrier metal layer is deposited, then subjected to a chemical mechanical polishing procedure, resulting in the barrier metal shape residing only on the top surface of the recessed metal contact structure. After deposition of an overlying second composite dielectric layer, photolithographic and reactive ion etching, (RIE), procedures are used to form a first opening in the second composite dielectric layer, exposing the top surface of the barrier metal shape, located on the top surface of the recessed metal contact structure; and to form a second opening in the second composite dielectric layer, and in a top portion of the first composite dielectric layer, exposing a region of insulator layer overlying a fuse structure. The barrier metal shape protected the underlying recessed metal contact structure, during the extended RIE procedure. A second barrier metal layer, and a conductive layer, are next deposited, followed by conventional photolithographic and RIE procedures, creating a bonding pad structure, in a region overlying and contacting, the recessed metal contact structure, structure. The same RIE procedure. unprotected by the photoresist shape used to define the bonding pad structure, results in the formation of spacers on the sides of the fuse opening.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
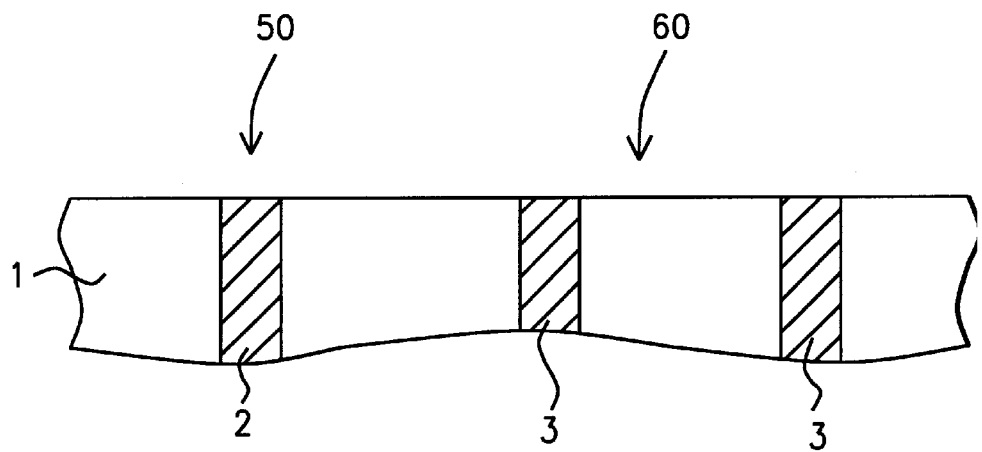
FIGS. 1–9, which schematically, in cross-sectional style, describe key stages of fabrication used to form an opening to a metal contact structure, and to simultaneously form a deeper opening to a fuse structure.

The method of forming an opening to a metal contact structure, and simultaneously forming a deeper opening to a fuse structure, will now be described in detail. FIG. 1, schematically shows metal plug structure 2, in region 50, to be used for a metal contact structure, and metal plug structures 3, in region 60, to be used for a fuse structure.

Metal plug structures 2 and 3, comprised of a metal chosen from a group that containing metals such as aluminum, tungsten, or copper, are located in via holes that in turn are opened in an intermetal dielectric, (IMD), layer 1, with IMD layer 1, comprised of an insulator layer such as a silicon oxide, or borophosphosilicate glass, (BPSG). The metal plug structures are formed via deposition of the metal, using plasma vapor deposition, (PVD), procedures, filling the via holes, followed by a chemical mechanical polishing, (CMP), procedure, resulting in the formation of the metal plug structures, in the via holes.

Figure 2:
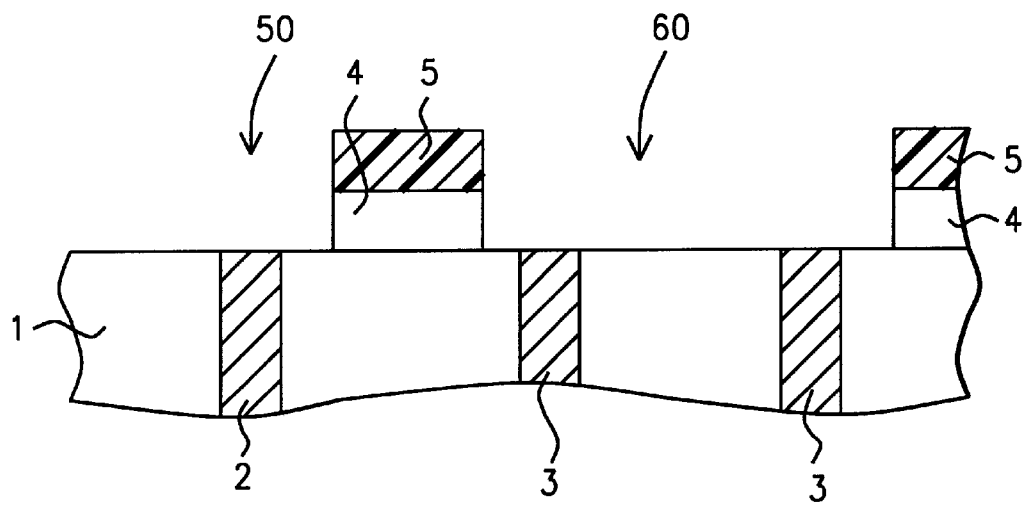
Figure 3:
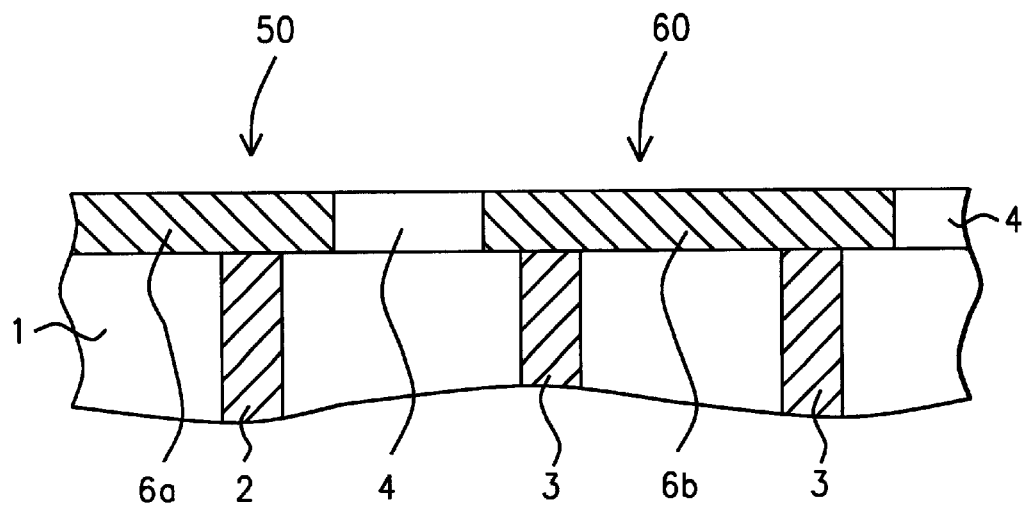

Deposition of another IMD layer, such as silicon oxide, or BPSG, obtained via low pressure chemical vapor deposition, (LPCVD), or via plasma enhanced chemical vapor deposition, (PECVD), procedures, is obtained at a thickness between about 3000 to 8000 Angstroms, then patterned via conventional photolithographic, (photoresist shape 5), and reactive ion etching, (RIE), to form IMD pad 4, shown schematically in FIG. 2. After removal of photoresist shape 5, via plasma oxygen ashing and careful wet cleans, an electrochemical deposition, (ECD), of copper, at a thickness between about 3000 to 8000 Angstroms is performed, followed by a CMP procedure, resulting in definition of metal pad, or metal interconnect structure 6a, in metal contact region 50, and metal pad, or fuse structure 6b, in fuse structure region 60. This is schematically shown in FIG. 3.

Figure 4:
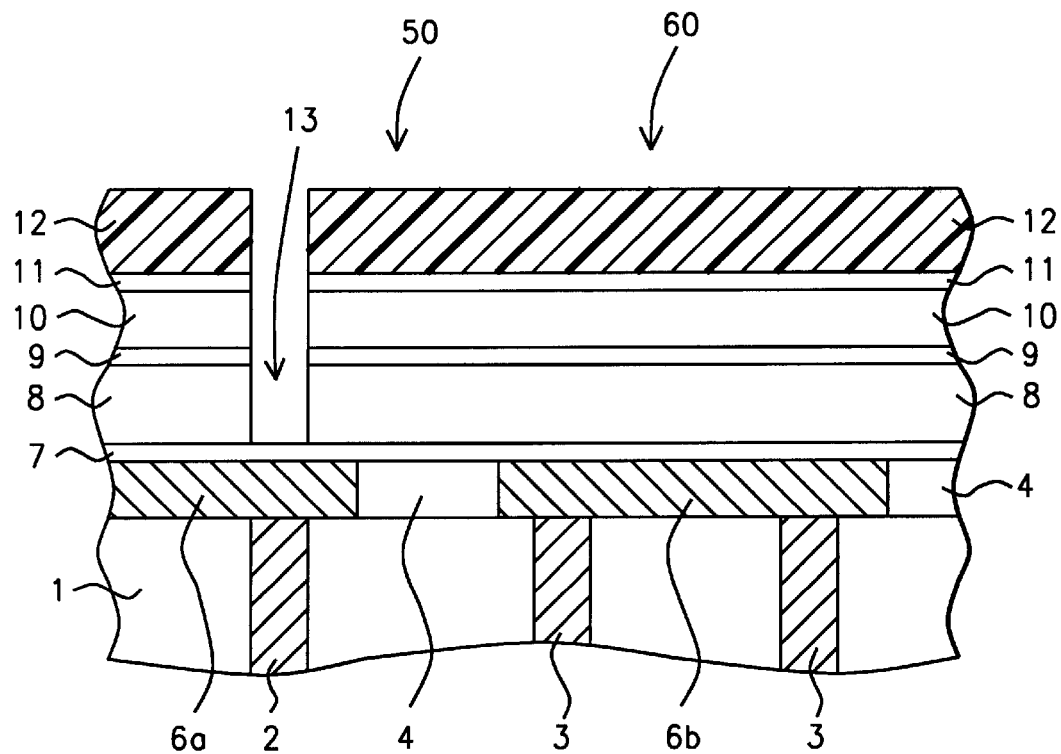

A series of insulator layers, to be used to accept a dual damascene opening in metal contact region 50, are next deposited, and shown schematically in FIG. 4. A liner layer 7, comprised of silicon nitride, is first deposited via LPCVD or PECVD procedures, at a thickness between about 300 to 1000 Angstroms, followed by deposition of insulator layer 8, comprised of either silicon oxide or BPSG, at a thickness between about 5000 to 10000 Angstroms, again using LPCVD or PECVD procedures. LPCVD or PECVD procedures are again employed to deposit etch stop layer, (ESL), 9, comprised of silicon nitride, at a thickness between about 300 to 800 Angstroms, followed by deposition of insulator layer 10, comprised of BPSG or silicon oxide, at a thickness between about 4000 to 15000 Angstroms. Finally another barrier layer 11, such as silicon nitride, or silicon oxynitride, is deposited, again via LPCVD or PECVD procedures, at a thickness between about 400 to 1200 Angstroms. Photoresist shape 12, is then used as an etch mask to allow a RIE procedure, using $CF_4$ as an etchant for the silicon nitride, or silicon oxynitride layers, and using $CHF_3$ as an etchant for the silicon oxide or BPSG layers, to form the narrow diameter component 13, of a subsequent dual damascene opening, exposing the top surface of metal structure 6a, in metal contact region 50. This is schematically shown in FIG. 4.

Figure 5:
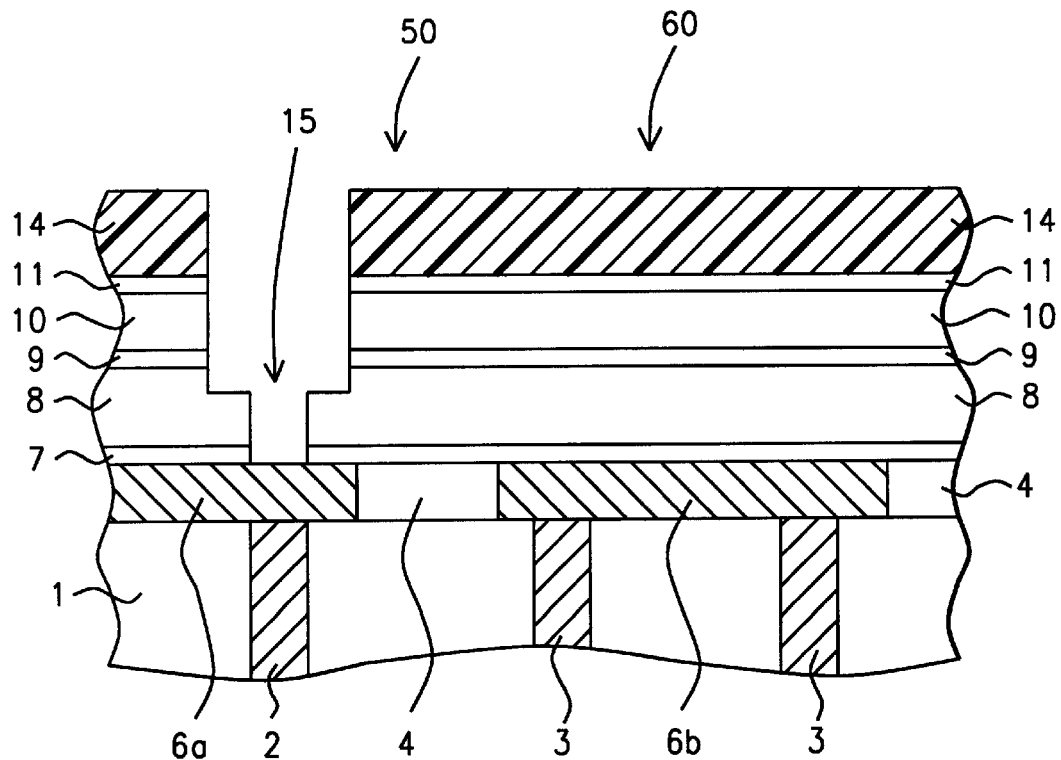
Figure 6:
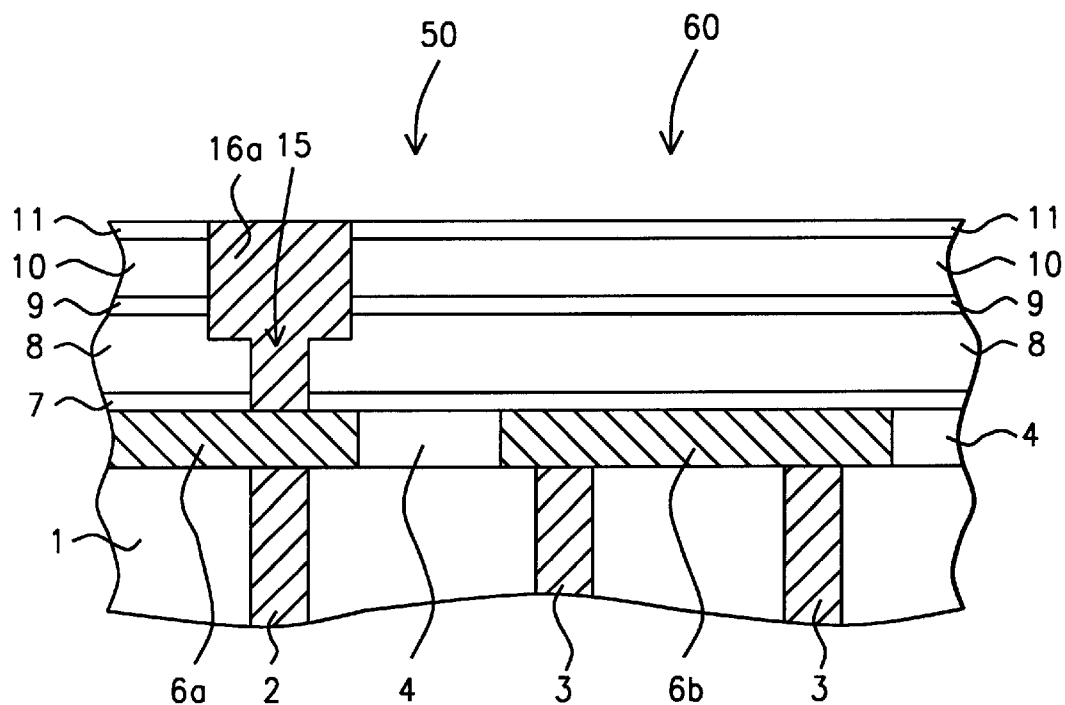

After removal of photoresist shape 12, used to define narrow diameter opening 13, via plasma oxygen ashing and careful wet cleans, photoresist shape 14, is formed and used as an etch mask to define wide diameter opening 15, via anisotropic RIE procedures, again using $CF_4$ as an etchant for silicon nitride, and using $CHF_3$ as an etchant for silicon oxide or BPSG. This is schematically shown in FIG. 5. After removal of photoresist shape 14, via plasma oxygen ashing and careful wet cleans, copper is deposited via ECD procedures, to a thickness between about 6000 to 20000 Angstroms, completely filling the dual damascene opening. A CMP procedure is next performed removing the regions of the copper layer from the top surface of silicon nitride layer 11, resulting in the formation of copper structure 16a, in dual damascene opening 15. This is schematically shown in FIG. 6.

Figure 7:
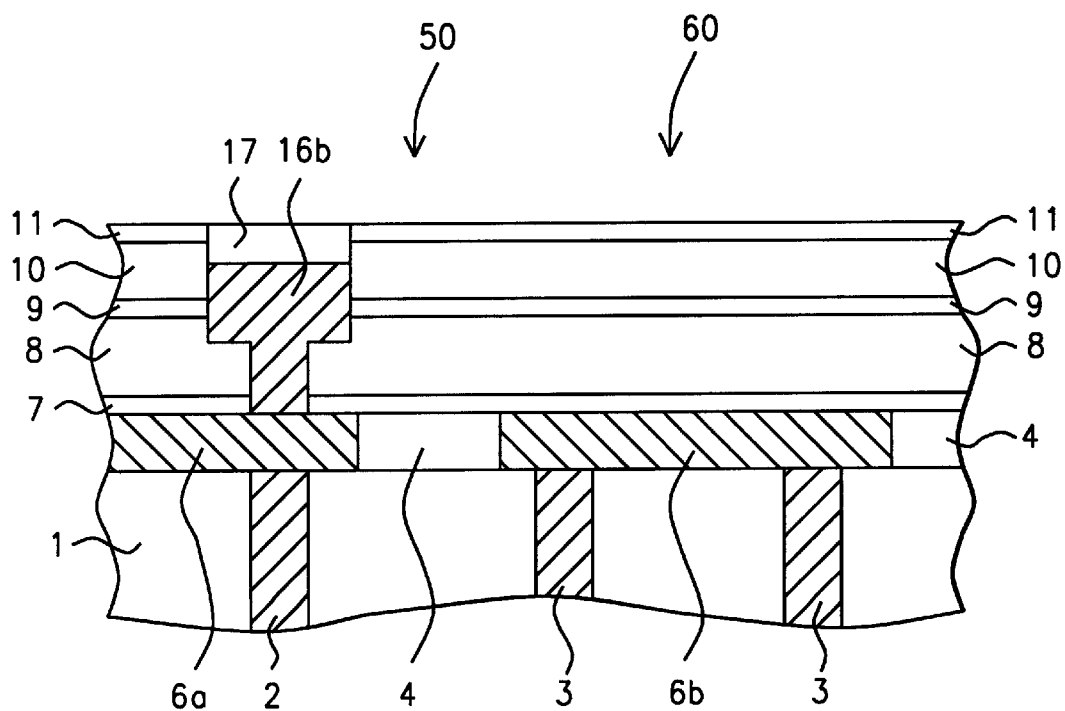

Preparing copper structure 16a, for protection from a subsequent RIE procedure, used to from a deep opening in fuse region 60, is next addressed. The objective is to place a metal barrier shape on the top surface of copper structure 16a, which will withstand the RIE procedure used to define a deep fuse opening, after a shallower opening to copper structure 16a, has been completed. The process used to satisfy this objective is initiated by recessing of copper structure 16a. This is accomplished via a blanket, selective wet etch procedure, removing, or recessing copper structure 16a, between about 1000 to 2000 Angstroms below the top surface of the dual damascene opening, resulting in recessed copper structure 16b, schematically shown in FIG. 7. The selective wet etch used for copper recessing allows the attainment of recessed copper structure 16b, to be accomplished without any etching of, or removal of silicon nitride layer 11. A barrier metal layer, such as tantalum nitride, is next deposited via PVD procedures, to a thickness between about 100 to 1000 Angstroms. A CMP procedure is then employed to selectively remove regions of the barrier metal layer from the top surface of silicon nitride layer 11, resulting in barrier metal shape 17, only overlying recessed copper structure 16b, and with the top surface of barrier metal shape 17, planar with the top surface of silicon nitride layer 11. This is schematically shown in FIG. 7.

Figure 8:
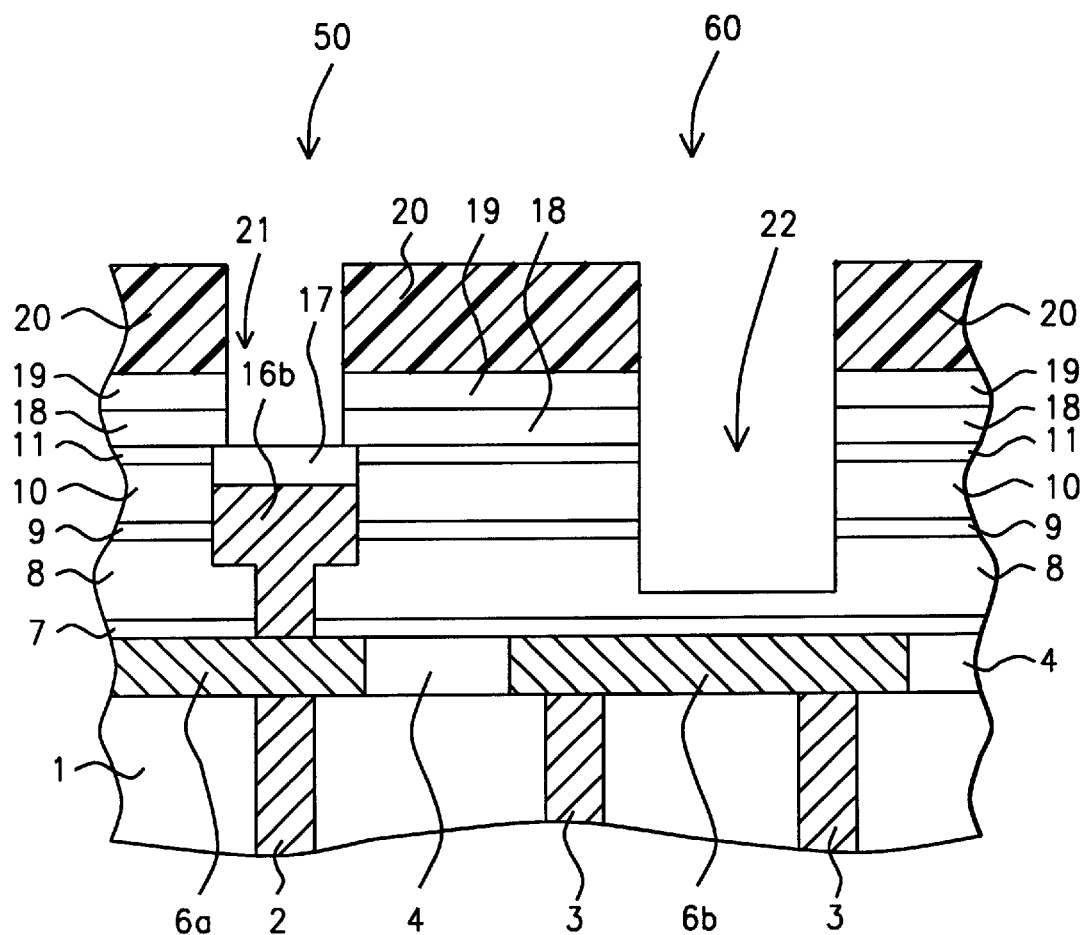

A composite insulator layer, comprised of an underlying silicon oxide layer 18, at a thickness between about 3000 to 6000 Angstroms, and an overlying silicon nitride layer 19, at a thickness between about 4000 to 10000 Angstroms, is next deposited via LPCVD or PECVD procedures. A photoresist shape 20, is next formed on the composite insulator layer, and used as a mask to allow an anisotropic RIE procedure, using $CF_4$ as an etchant for silicon nitride layers, and $CF_3$ as an etchant for silicon oxide and BPSG layers, to define deep opening 22, in fuse region 60, with the RIE procedure terminated in insulator layer 8. The bottom of deep opening 22, is located between about 5000 to 10000 Angstroms above the top surface of metal structure 6b, in fuse region 60. The same photolithographic and anisotropic RIE procedure results in the definition of shallow opening 21, in metal contact region 50 The presence of tantalum nitride shape 17, with a low etch rate in $CF_4$ and $CHF_3$, protected underlying copper structure 16b, during the definition of deeper opening 22 The etch rate ratio of silicon oxide, and silicon nitride, to tantalum nitride, in a $CF_4$ or in a $CHF_3$ ambient, is between about 100 to 1. This is schematically shown in FIG. 8.

Figure 9:
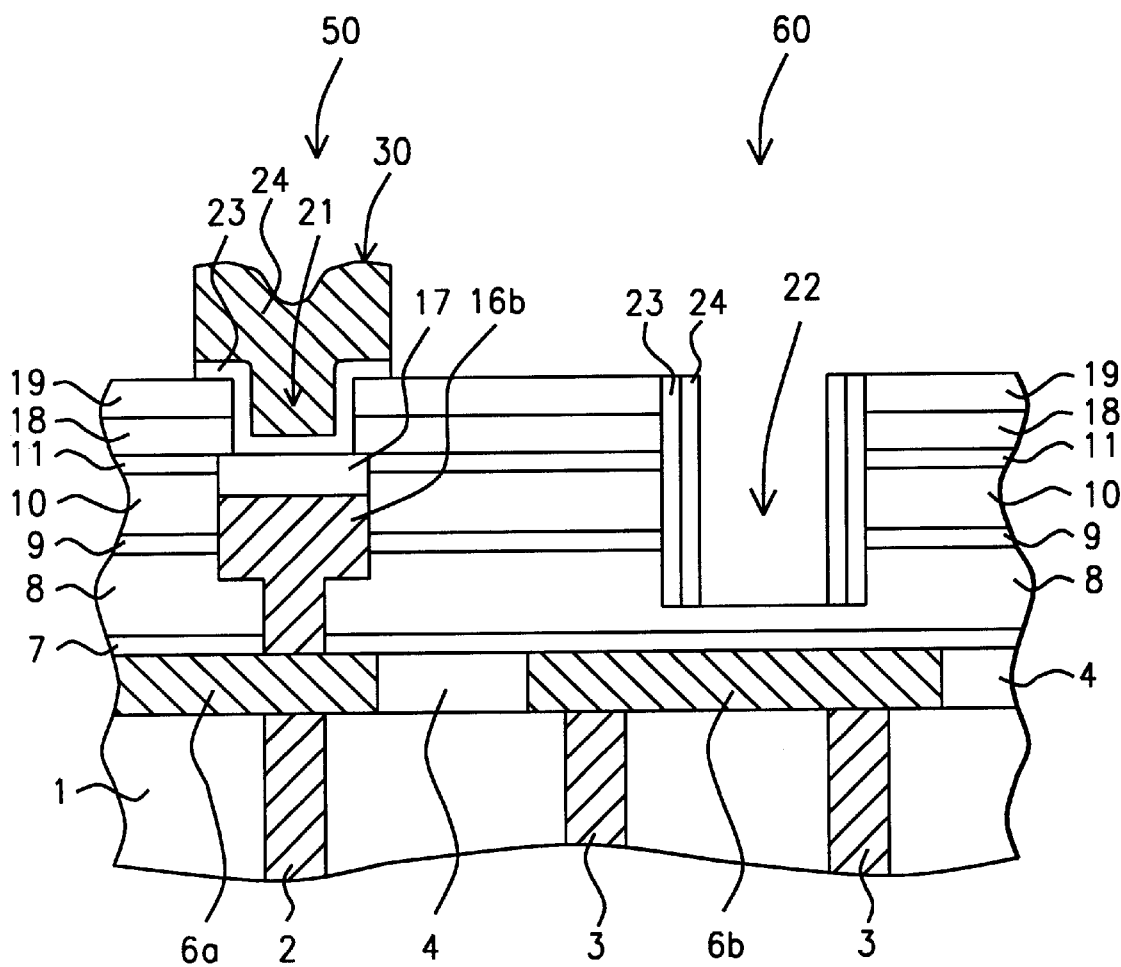

After removal of photoresist shape 20, via plasma oxygen ashing and careful wet cleans, shallow opening 21, exposing recessed copper structure 16b, is prepared for either wire bonding to a ceramic module or package, or is prepared for a subsequent flip chop configuration, also used to connect a semiconductor chip to a module or carrier. For the case of a subsequent wire bond, a tantalum nitride layer 23, is deposited via PVD procedures, to a thickness between about 300 to 1000 Angstroms, followed by the deposition of aluminum layer 24, via PVD procedures, at a thickness between about 4000 to 1500 Angstroms. Aluminum layer 24, completely fills shallow opening 21b, while only coating the exposed surfaces of deeper opening 22. A photoresist shape, not shown in the drawings, is then formed on a portion of aluminum layer 24, in a region overlying recessed copper structure 16b, while the remaining portion of aluminum layer 24, is not covered by photoresist. A selective RIE procedure, using $Cl_2$ or $SF_6$ as an etchant, are used to define wire bond pad 30, comprised of aluminum layer 24, and underlying tantalum nitride layer 23. The same selective RIE procedure results in the removal of both aluminum layer 24, and of tantalum nitride layer 23, in the bottom of deeper opening 22, exposing the bottom portion of insulator layer 8, overlying metal structure 6b, in fuse region 60. In addition, spacers comprised of aluminum layer 24, and tantalum nitride layer 23, are formed on the sides of deeper opening 22. The photoresist shape used to define wire bond pad 30, is again removed via plasma oxygen ashing and careful wet cleans. The result of these procedures is schematically shown in FIG. 9. The spacers formed on the sides of deeper opening 22, will protect the materials adjacent to this opening during a high voltage pulse or a laser application, used to convert a high resistance fuse structure, to a lower resistance structure, allowing electrical connection between elements or arrays, located at both ends of the fuse structure. A wire bond, such as a gold bond, can now be successfully made on bond pad structure 30, allowing electrical communication between underlying conductive regions, of a semiconductor chip, and a ceramic package, to be realized.

While this invention has been particularly shown and described with reference to, the preferred embodiments thereof, it will be understood by those skilled in the art that various changes in form and details may be made without departing from the spirit and scope of this invention.

What is claimed is:

1. A method of simultaneously forming a first opening to a metal contact pad structure, and a second opening, overlying a fuse structure, comprising the steps of;

providing said fuse structure, embedded in a first insulator layer, and providing a metal interconnect structure, embedded in said first insulator layer, depositing a first composite dielectric layer;

forming a dual damascene opening in said first composite dielectric layer, exposing a portion of the top surface of said metal interconnect structure;

forming said metal contact pad structure in said dual damascene opening wherein portions of a metal layer, used for sad metal contact pad structure, are removed from top surface of said first composite dielectric layer via a first chemical mechanical polishing (CMP) procedure;

performing a selective wet etch procedure to recess said metal contact pad structure below the top surface of said first composite dielectric layer, resulting in a recessed metal contact pad structure;

forming a barrier metal shape an the top surface of said recessed metal contact pad structure, via deposit on of a barrier layer and removal of portions of said barrier layer from the top surface of said first composite dielectric layer via a second CMP procedure;

depositing a second composite dielectric layer;

performing an anisotropic, reactive ion etching, (RIE), procedure to form said first opening in said second composite dielectric layer, exposing a portion of the top surface of said barrier metal shape; and to form said second opening in said second composite dielectric layer, and in a top portion of said first composite dielectric layer, with said second opening overlying a bottom portion of said first composite dielectric layer, which overlays a portion of said fuse structure;

depositing a battier metal layer, and an overlying aluminum layer; and patterning of said aluminum layer, and of said barrier metal layer, to form a wire bond pad structure, in said first opening, overlying and contacting said recessed metal contact pad structure; and to form aluminum—barrier metal spacers, on the sides of said second opening.

2. The method of claim 1, wherein said fuse structure is comprised of copper, obtained via electrochemical deposition, at a thickness between about 3000 to 8000 Angstroms.

3. The method of claim 1, wherein said first composite dielectric layer is comprised of an underlying, first silicon nitride layer, obtained via LPCVD or PECVD procedures, at a thickness between about 300 to 1000 Angstroms; a first silicon oxide, or BPSG layer, obtained via LPCVD or PECVD procedures, at a thickness between about 5000 to 10000 Angstroms; a second silicon nitride layer, obtained via LPCVD or PECVD procedures, at a thickness between about 300 to 800 Angstroms; a second silicon oxide or BPSG layer, obtained via LPCVD or PECVD procedures, at a thickness between about 4000 to 15000 Angstroms; and an overlying third silicon nitride, or silicon oxynitride layer, obtained via LPCVD or PECVD procedures, at a thickness between about 400 to 1200 Angstroms.

4. The method of claim 1, wherein said dual damascene opening, in said first composite dielectric layer, is defined via anisotropic RIE procedures, using $CF_4$ as an etchant for silicon nitride, or silicon oxynitride layers, and using $CHF_3$ as an etchant for silicon oxide or BPSG layers.

5. The method of claim 1, wherein said metal layer, used for said metal contact pad structure, is a copper layer, obtained via electrochemical deposition, at a thickness between about 6000 to 20000 Angstroms, with removal of portions of copper from the top surface of said first composite dielectric layer accomplished via said chemical mechanical procedure.

6. The method of claim 1, wherein said metal pad structure is recessed between about 1000 to 2000 Angstroms, below the top surface of said first composite dielectric layer, via said wet etch procedure.

7. The method of claim 1, wherein said barrier layer used for said barrier metal shape is a tantalum nitride layer, obtained via PVD procedure, at a thickness between about 100 to 1000 Angstroms, with portions of said barrier layer removed from the top surface of said first composite dielectric layer via said second CMP procedure.

8. The method of claim 1, wherein said second composite dielectric layer is comprised of an underlying silicon oxide layer, obtained via LPCVD or PECVD procedures, at a thickness between about 3000 to 6000 Angstroms, and comprised of an overlying silicon nitride layer, obtained via LPCVD or PECVD procedures, at a thickness between about 4000 to 10000 Angstroms.

9. The method of claim 1, wherein said first opening is formed via said anisotropic RIE procedure, using $CF_4$ as an etchant for the silicon nitride component of said second composite dielectric layer, and using $CHF_3$ as an etchant for the silicon oxide component of said second composite dielectric layer.

10. The method of claim 1, wherein said second opening is formed via said anisotropic RIE procedure: using $CF_4$ as an etchant for the silicon nitride components in said second composite dielectric layer, and for the silicon nitride components in said first composite dielectric layer, while using $CHF_3$ as an etchant for the silicon oxide, or BPSG components in said second composite dielectric layer, and for the silicon oxide, or BPSG components in said first composite dielectric layer.

11. The method of claim 1, wherein said second opening terminates in said first composite dielectric layer, between about 5000 to 10000 Angstroms above the top surface of said fuse structure.

12. A method of simultaneously forming a first opening to a tantalum nitride barrier shape, located overlaying a recessed copper contact structure, and forming a deeper, second opening, overlying a fuse structure, comprising the steps of:

provi ding a metal interconnect structure, embedded in an insulator layer, and providing said fuse structure, embedded in said insulator layer;

depositing a first composite dielectric layer comprised of an underlying, first silicon nitride layer, a first silicon oxide layer, a second silicon nitride layer, a second silicon oxide layer, and an overlying, third silicon, nitride layer;

forming a dual damascene opening in said first composite dielectric layer, exposing a portion of the top surface of said metal interconnected structure;

depositing a copper layer;

performing a first chemical mechanical polishing procedure to re move portions of said copper layer from the top surface of said first composite dielectric layer, to define a copper contact structure in said dual damascene opening;

performing a selective wet etch procedure to recess said copper contact structure below top surface of said first composite dielectric layer, creating said recessed copper contact structure, depositing a first tantalum nitride layer;

removing portion of said first tantalum nitride from the top surface of said first composite dielectric layer via second CMP procedure, creating said tantalum nitride barrier shape, overlying said recessed copper contact structure;

depositing a second composite dielectric layer comprised of an underlying third silicon oxide layer, and an overlying, fourth silicon nitride layer;

performing an anisotropic RIE procedure: to form said first opening in said second composite dielectric layer, exposing a portion of a top surface of said tantalum nitride barrier shape, overlying said recessed copper pad structure; and to form said deeper, second opening, in said second composite dielectric layer, and in a top portion of said first composite dielectric layer, exposing a bottom portion of said first silicon oxide layer, of said first composite insulator layer, overlying a top portion of said fuse structure;

depositing a second tantalum nitride layer;

depositing an aluminum layer; and patterning of said aluminum layer, and of said second tantalum nitride layer, to form a wire bond pad structure in said first opening, overlying and contacting said tantalum nitride barrier shape, and forming spacers on the sides of said deeper, second opening, with said spacers comprised of aluminum—second tantalum nitride.

13. The method of claim 12, wherein said copper layer is obtained via electrochemical procedures, at a thickness between about 6000 to 20000 Angstroms.

14. The method of claim 12, wherein said copper pad structure is recessed to a level between about 1000 to 2000 Angstroms below the top surface of said first composite dielectric layer, via said wet etch procedure.

15. The method of claim 12, wherein said first tantalum nitride layer is obtained via PVD procedures, to a thickness between about 100 to 1000 Angstroms.

16. The method of claim 12, wherein said second composite dielectric layer is comprised of underlying, said third silicon oxide layer, obtained via LPCVD or PECVD procedures, at a thickness between about 3000 to 6000 Angstroms, and comprised of an overlying, fourth silicon nitride layer, obtained via LPCVD of PECVD procedures, at a thickness between about 4000 to 10000 Angstroms.

17. The method of claim 12, wherein said first opening, in said second composite dielectric layer, is formed via said anisotropic RIE procedure, using $CF_4$ as an etchant for said fourth silicon nitride layer, and using $CHF_3$ as an etchant for said third silicon oxide layer.

18. The method of claim 12 wherein said deeper, second opening, in said second composite dielectric layer, and in a top portion of said first composite dielectric layer, is formed via said anisotropic RIE procedure, using $CF_4$ as an etchant silicon nitride layers, and using $CHF_3$ as an etchant for silicon oxide layers.

19. The method of claim 12, wherein said deeper, second opening terminates in said first silicon oxide layer, between about 5000 to 10000 Angstroms above the top surface of said fuse structure.

20. The method of claim 12, wherein said second tantalum nitride layer is obtained via PVD procedures, at a thickness between about 300 to 1000 Angstroms.

21. The method of claim 12, wherein said aluminum layer is obtained via PVD procedures, at a thickness between about 4000 to 15000 Angstroms.

22. The method of claim 12, wherein said patterning procedure, used to define said wire bond pad structure, is a RIE procedure, using $Cl_2$ or $SF_6$ as an etchant for said aluminum layer, and for said second tantalum nitride layers.

* * * * *